US007166873B2

(12) United States Patent
Okazaki

(10) Patent No.: US 7,166,873 B2
(45) Date of Patent: Jan. 23, 2007

(54) LIGHT EMITTING DEVICE

(75) Inventor: Jun Okazaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 210 days.

(21) Appl. No.: 10/669,498

(22) Filed: Sep. 23, 2003

(65) Prior Publication Data

US 2004/0066815 A1 Apr. 8, 2004

(30) Foreign Application Priority Data

Oct. 3, 2002 (JP) ............................ 2002-291455

(51) Int. Cl.
*H01L 33/00* (2006.01)

(52) U.S. Cl. .......................... 257/98; 257/99; 257/100; 257/E33.058; 257/E33.059

(58) Field of Classification Search .................. 372/43
See application file for complete search history.

(56) References Cited

U.S. PATENT DOCUMENTS 6,299,328 B1 * 10/2001 Wilson ....................... 362/223
6,340,824 B1 * 1/2002 Komoto et al. ............... 257/99
6,856,087 B1 * 2/2005 Lin et al. .................... 313/500
6,914,267 B1 * 7/2005 Fukasawa et al. ............ 257/98

FOREIGN PATENT DOCUMENTS

JP 08-202247 A 8/1996
JP 2900928 4/1998
JP 2927279 9/1998
JP 2000-512806 T 9/2000
JP 3152238 2/2001
JP 2001-230451 A 8/2001

OTHER PUBLICATIONS

Full translation of JP 08-202247 (original published Sep. 8, 1996).*

* cited by examiner

*Primary Examiner*—James Menefee
(74) *Attorney, Agent, or Firm*—Morrison & Foerster LLP

(57) ABSTRACT

A light emitting device includes a semiconductor laser chip which emits a laser beam; a coherence reducing member which receives the laser beam and reduces coherence of the laser beam to generate a lower coherence light beam; and a package which houses the laser chip and the coherence reducing member, the package having an opening; wherein the laser beam emitted from the laser chip is converted into a lower coherence light beam by the coherence reducing member, and the lower coherence light beam is outputted through the opening.

9 Claims, 5 Drawing Sheets

5c
3b
6c
F
F
2c
7b 6c
7b
3b
1c
6c
8c
4b
5c
9c
2c
8d
8e
4c
4d
9e
9d

LIGHT EMITTING DEVICE

CROSS-REFERENCES TO RELATED APPLICATIONS

This application is related to Japanese Patent Application No. 2002-291455 filed on Oct. 3, 2002, whose priory is claimed under 35 USC § 119, the disclosure of which is incorporated by reference in its entirety.

BACKGROUND OF THE INVENTION

1. Field of the Invention

The present invention relates to a light emitting device and, particularly, to a light emitting device employing a semiconductor laser chip.

2. Description of the Related Art

A light source is conventionally known, which is adapted to generate white light by exciting a fluorescent material contained in a transparent resin by a light emitting diode (LED) (see, for example, Japanese Patent No. 2927279 (0017)-(0018)).

In recent years, such light sources employing a LED have been employed instead of conventional light bulbs for traffic lights and indicators on instrument panels. Further, the light sources have been employed for domestic lighting apparatuses (e.g., desk lights).

A LED chip generally has an output capacity of several milliwatts to 10 mW at the maximum and, hence, has difficulty in providing a high output. On the other hand, a semiconductor laser chip has a higher output capacity on the order of 30 to 50 mW. However, the semiconductor laser chip emits a highly coherent light beam with even phases and, hence, is deleterious to human eyes. Therefore, it is difficult to employ the semiconductor laser chip as an ordinary light source.

SUMMARY OF THE INVENTION

In view of the foregoing, the present invention is directed to a light emitting device which employs a semiconductor laser chip and is capable of outputting light having a reduced coherence for use as an ordinary light source.

According to the present invention, there is provided a light emitting device, which comprises: a semiconductor laser chip which emits a laser beam; a coherence reducing member which receives the laser beam and reduces coherence of the laser beam to generate a lower coherence light beam; and a package which houses the laser chip and the coherence reducing member, the package having an opening; wherein the laser beam emitted from the laser chip is converted into a lower coherence light beam by the coherence reducing member, and the lower coherence light beam is outputted through the opening.

DETAILED DESCRIPTION OF THE INVENTION

Figure 1:
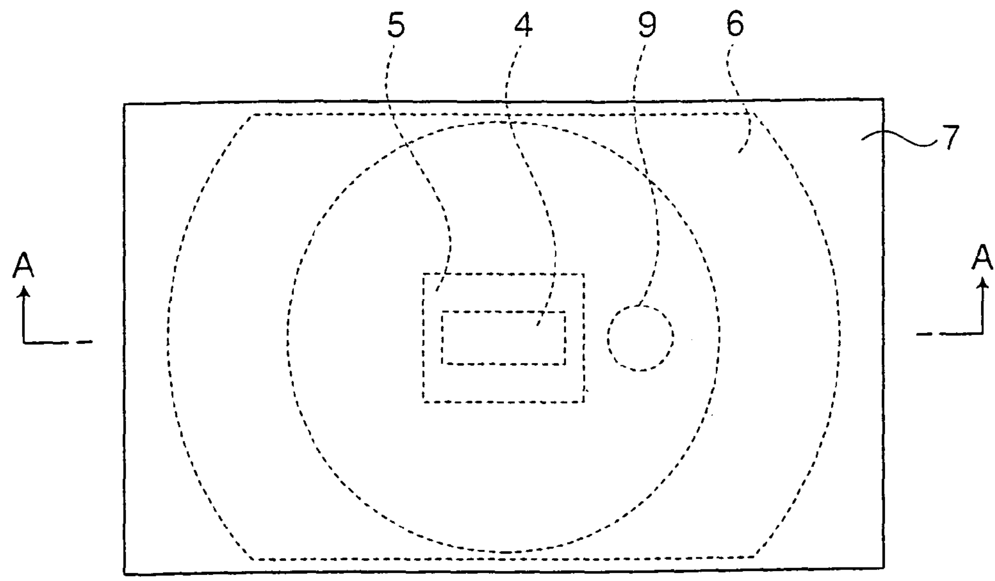
FIG. 1 is a top view of a light emitting device according to a first embodiment of the present invention.

A light emitting device according to the present invention comprises: a semiconductor laser chip which emits a laser beam; a coherence reducing member which receives the laser beam and reduces coherence of the laser beam to generate a lower coherence light beam; and a package which houses the laser chip and the coherence reducing member, the package having an opening; wherein the laser beam emitted from the laser chip is converted into a lower coherence light beam by the coherence reducing member, and the lower coherence light beam is outputted through the opening.

In the present invention, the coherence reducing member may be composed of a fluorescent material which is excited by the laser beam emitted from the semiconductor laser chip to generate fluorescent light having a greater wavelength than the laser beam. The fluorescent light is non-coherent. In this case, the fluorescent material comprises a base, an activator and a flux. The base may be selected from the group consisting of inorganic fluorescent materials including oxides, sulfides, silicates and vanadates of rare earth elements such as zinc, cadmium, magnesium, silicon and yttrium, and organic fluorescent materials such as fluorescein, Eosine and oils (mineral oils). The activator is selected from the group consisting of silver, copper, manganese, chromium, europium, zinc, aluminum, lead, phosphorus, arsenic and gold. The flux is selected from the group consisting of sodium chloride, potassium chloride, magnesium carbonate and barium chloride.

In the present invention, the semiconductor laser chip may be a chip which emits a purple-blue laser beam, and the coherence reducing member may be a fluorescent layer which is excited by the purple-blue laser beam to generate white light.

The purple-blue laser beam herein means a laser beam having a wavelength of 360 to 480 nm. The fluorescent layer which is exited by the laser beam to generate the white light is preferably composed of a cerium-activated yttrium-aluminum-garnet fluorescent material, for example, $Y_3Al_5O_{12}$:Ce, $Y_3(Al_{0.6}Ga_{0.4})_5O_{12}$:Ce or $Y_3(Al_{0.5}Ga_{0.5})_5O_{12}$:Ce.

The coherence reducing member may be a reflective member having a reflective surface roughened for reflecting the laser beam incident thereon in an unevenly phase-shifted manner. In this case, the reflective member may have a satin-finished reflective surface, for example, a reflective metal surface such as of aluminum finely roughened by polishing or etching, or a reflective resin surface roughened by coarsely depositing a metal thereon.

The roughened reflective surface preferably has a roughness such that a level difference of undulations thereof is several times to several tens times the wavelength of the incident laser beam. Thus, the uneven phase shift of the incident laser beam is efficiently achieved, whereby the coherence of the incident laser beam is reduced or lost.

The semiconductor laser chip may be a laser chip of end light emission type which emits the purple-blue laser beam in two directions parallel to a PN junction plane thereof, or a laser chip of face light emission type.

In the present invention, the package may have a positive electrode terminal and a negative electrode terminal for applying a DC voltage to the semiconductor laser chip. The package may include a metal block for dissipating heat generated by the semiconductor laser chip. The semiconductor laser chip may comprise at least one of three laser chips which emit red, green and blue light beams, respectively.

The package may include a light transmissive plate fitted in the opening thereof. In this case, the light transmissive plate may have a concave or convex lens function for converging or diverging the light outputted from the package. The light transmissive plate may comprise a fluorescent material. The coherence reducing member may comprise a fluorescent member for converting the laser beam emitted from the laser chip into fluorescent light, and a reflective member for reflecting the fluorescent light emitted from the fluorescent member toward the opening.

With reference to the attached drawings, the present invention will hereinafter be described by way of embodiments thereof. It should be understood that the present invention be not limited to these embodiments.

First Embodiment

Figure 2:
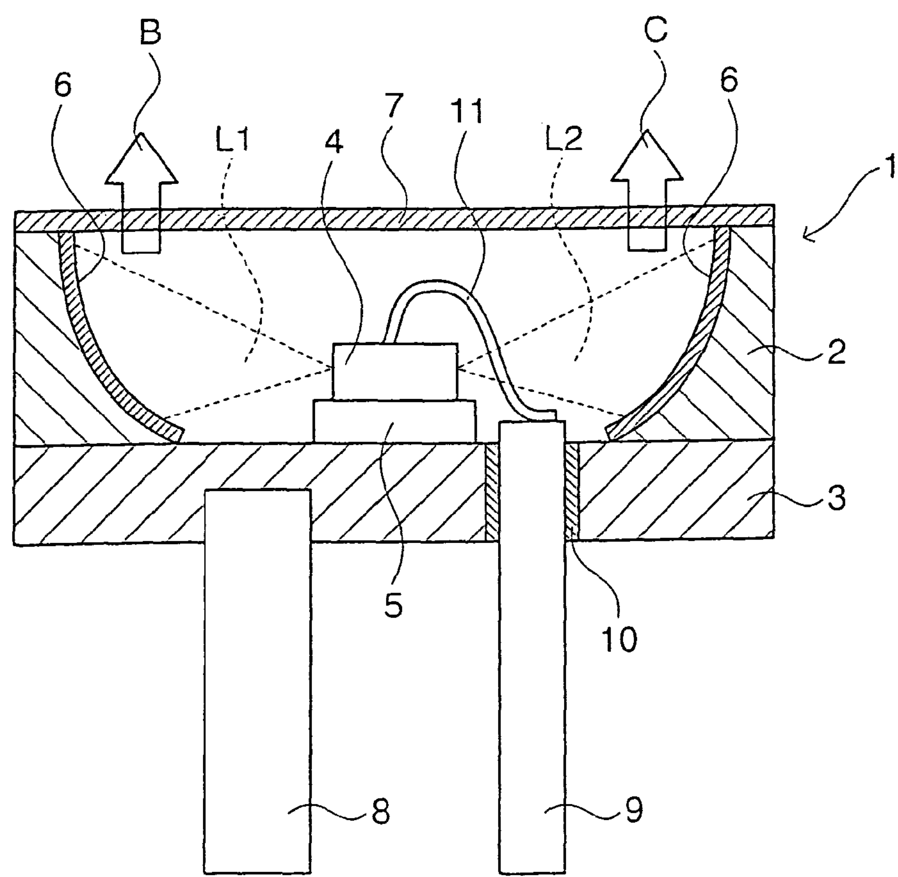
FIG. 2 is a sectional view of the light emitting device as seen in an arrow direction A—A in FIG. 1.

FIG. 1 is a top view of a light emitting device according to a first embodiment of the present invention, and FIG. 2 is a sectional view of the light emitting device as seen in an arrow direction A—A in FIG. 1.

As shown, a package 1 includes a side wall portion 2 and a metal bottom portion 3. A semiconductor laser chip 4 of end light emission type is disposed on the bottom portion (stem) 3 with the intervention of a metal mount 5 in a generally central portion of the package 1. The laser chip 4 is adapted to emit laser beams L1, L2 having a wavelength of 350 to 480 nm in two directions parallel to a PN junction plane thereof. The side wall portion 2 has a concave inside shape as seen in section in FIG. 2, and a fluorescent layer 6 is provided on the interior surface of the side wall portion 2. Further, a top opening of the side wall portion 2 is closed by a light transmissive protective plate 7.

Two metal rod terminals 8, 9 are provided vertically in the bottom portion 3. The metal terminal 8 is directly connected to the bottom portion 3. The metal terminal 9 extends through the bottom portion 3, and an insulative member 10 intervenes between the metal terminal 9 and the bottom portion 3. The metal terminal 8 is electrically connected to an n-electrode of the laser chip 4 via the bottom portion 3 and the mount 5, while the metal terminal 9 is electrically connected to a p-electrode of the laser chip 4 via a fine metal wire 11. A wire of gold, platinum or aluminum having a diameter of about 30 μm is employed as the fine metal wire 11.

The side wall portion 2 is composed of a polyimide resin, and the protective plate 7 is composed of an epoxy resin. The fluorescent layer 6 is composed of an yttrium-aluminum-garnet fluorescent material. The inside of the package closed by the protective plate 7 may be evacuated to vacuum as required.

When a predetermined driving voltage is applied between the metal terminals 8 and 9, the laser beams L1, L2 are emitted from the laser chip 4. The laser beams L1, L2 impinge on the fluorescent layer 6 to excite the fluorescent layer 6. Thus, non-coherent white light having a light emission peak at a wavelength of about 500 nm to about 600 nm is generated, and outputted in arrow directions B, C from the package 1.

Therefore, the fluorescent layer 6 is preferably dimensioned and configured so as to sufficiently receive the laser beams L1, L2, efficiently convert the received laser beams L1, l2 into the white light and effectively output the white light from the package 1.

The laser beams L1, L2 may include light components reflected on the fluorescent layer 6 and outputted from the package 1 as they are. In such a case, a fluorescent material is preliminarily contained in the protective plate 7, so that the fluorescent material is excited by the light component. Thus, the laser beams L1, L2 are prevented from being outputted from the package 1 as they are. The same material as for the fluorescent layer 6 may be employed as the fluorescent material for the protective plate 7.

Second Embodiment

Figure 3:
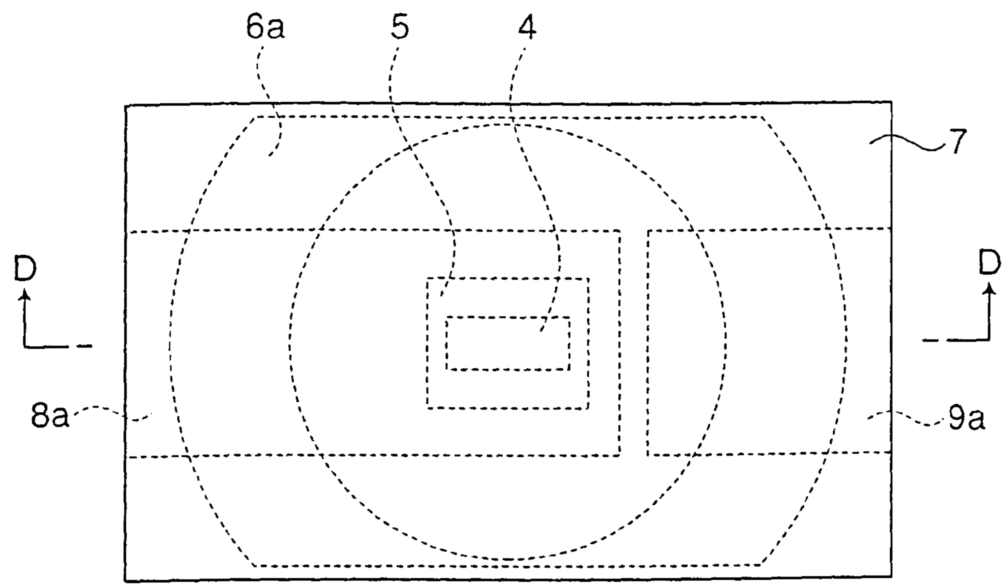
FIG. 3 is a top view of a light emitting device according to a second embodiment of the present invention.
Figure 4:
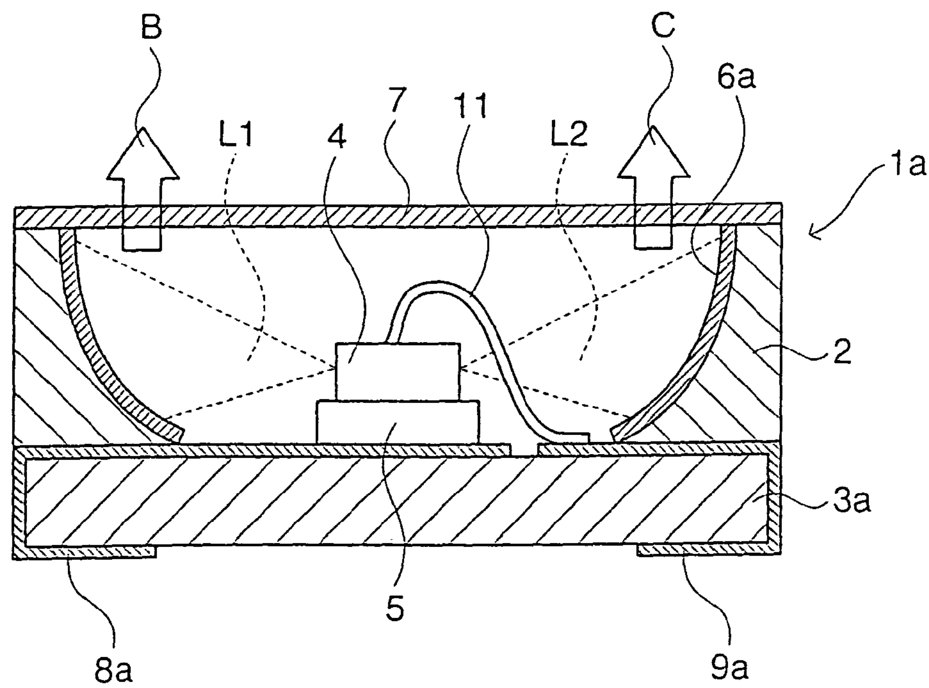
FIG. 4 is a sectional view of the light emitting device as seen in an arrow direction D—D in FIG. 3.

FIG. 3 is a top view of a light emitting device according to a second embodiment of the present invention, and FIG. 4 is a sectional view of the light emitting device as seen in an arrow direction D—D in FIG. 3.

As shown, this embodiment is provided by partly modifying the first embodiment. That is, the package 1 is replaced with a package 1*a*. More specifically, the light emitting device of the second embodiment has substantially the same construction as that of the first embodiment, except that the fluorescent layer 6, the bottom portion 3 and the metal terminals 8, 9 in the first embodiment are replaced with a reflective layer 6*a*, an insulative substrate 3*a* and metal interconnection patterns 8*a*, 9*a*, respectively.

The reflective layer 6*a* is formed as having a satin-finished surface by depositing aluminum on the interior surface of the side wall portion 2. The reflective layer 6*a* has a surface roughness such that the average level difference of undulations thereof is about ten times the wavelength of the laser beams L1, L2, i.e., about 5 μm.

When a predetermined driving voltage is applied between the interconnection patterns 8*a* and 9*a*, the laser beams L1, L2 emitted from the laser chip 4 are irregularly reflected on the reflective layer 6*a* thereby to be converted into non-coherent light with uneven phases. Then, the non-coherent light is outputted in arrow directions B, C from the package 1*a*.

In this embodiment, the laser chip 4 may be adapted to emit light beams having any wavelength within a spectral range from purple to red. The surface roughness of the reflective layer 6*a* should be adjusted optimally depending on the wavelength.

Third Embodiment

Figure 5:
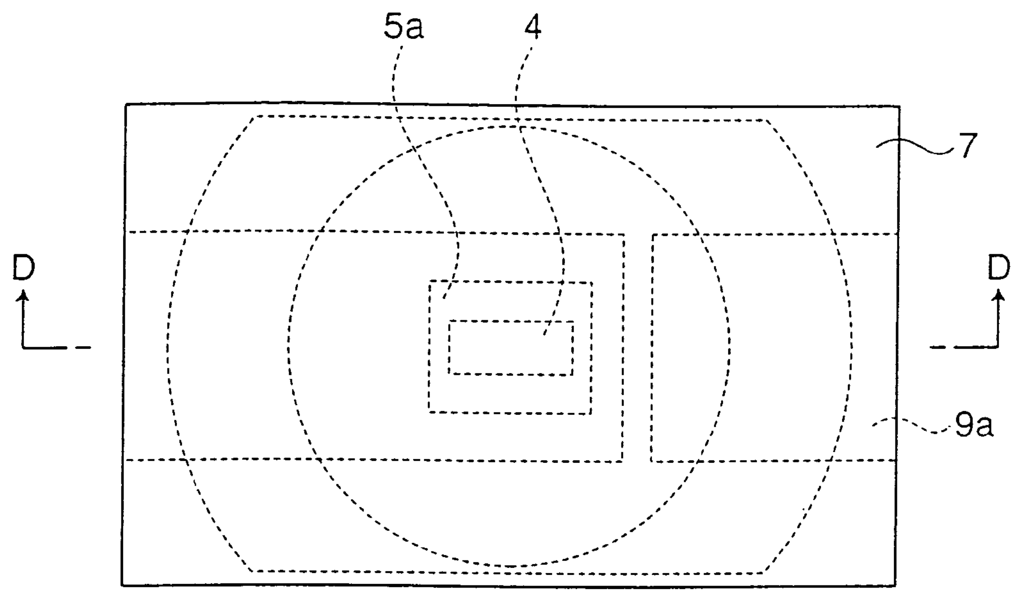
FIG. 5 is a top view of a light emitting device according to a third embodiment of the present invention.
Figure 6:
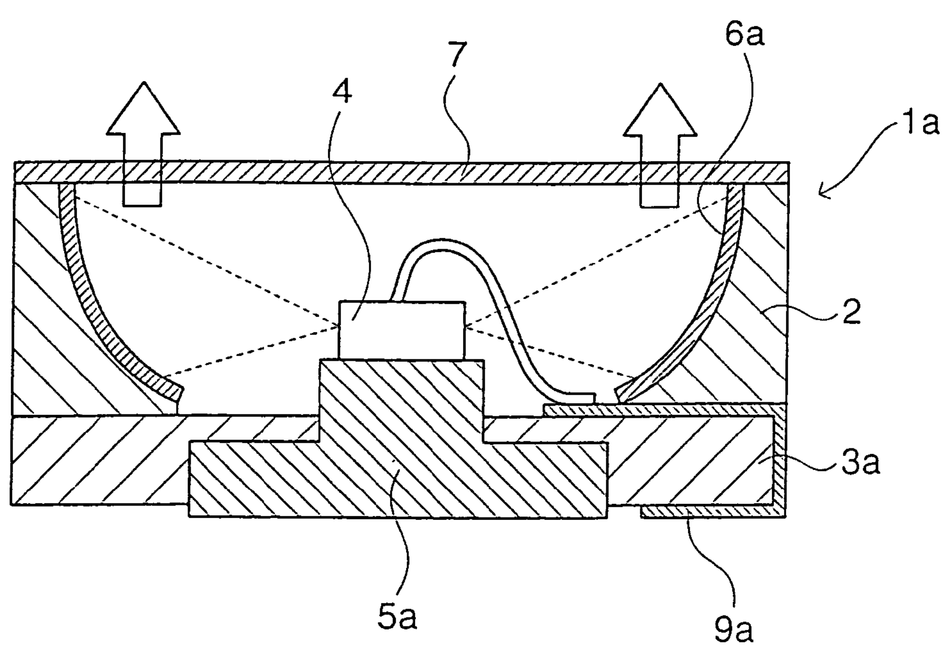
FIG. 6 is a sectional view of the light emitting device as seen in an arrow direction D—D in FIG. 5.

FIGS. 5 and 6 illustrate a third embodiment of the present invention, and correspond to FIGS. 3 and 4, respectively, which illustrate the second embodiment. A light emitting device of the third embodiment has substantially the same construction as that of the second embodiment, except that the metal mount 5 and the metal pattern 8*a* in the second embodiment are replaced with a metal heat sink block 5*a*.

In this embodiment, the heat sink block 5*a* extends through the insulative substrate 3*a*, and is partly exposed from the package 1*a*. Thus, the heat capacity can sufficiently be increased as compared with the mount 5 (FIG. 4). Thus, heat generated by the semiconductor laser chip 4 can efficiently be absorbed and dissipated in this embodiment. Therefore, a relatively high capacity chip can be employed as the semiconductor laser chip 4.

Fourth Embodiment

Figure 7:
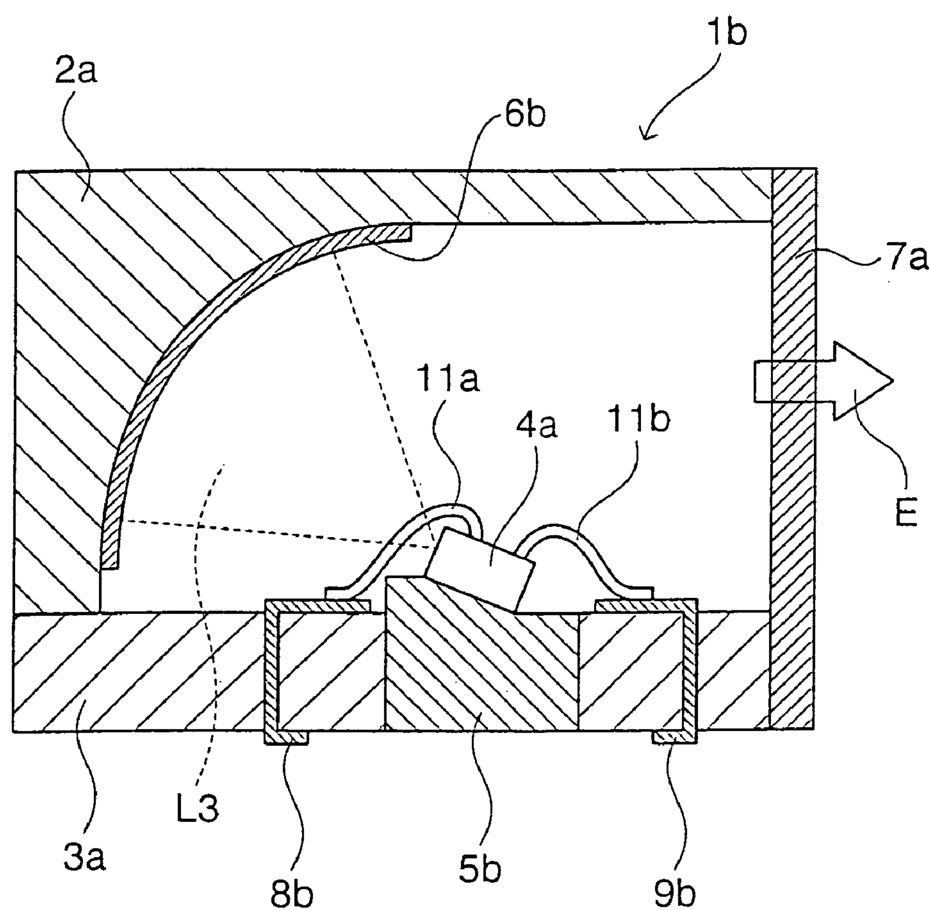
FIG. 7 is a vertical sectional view of a light emitting device according to a fourth embodiment of the present invention.

FIG. 7 is a vertical sectional view of a light emitting device according to a fourth embodiment of the present invention.

As shown, a package 1*b* includes a side wall portion 2*a* and an insulative substrate 3*a*. The insulative substrate 3*a* includes metal interconnection patterns 8*b*, 9*b*. A semiconductor laser chip 4*a* is disposed on a metal heat sink block 5*b* which extends through the insulative substrate 3*a*. The side wall portion 2*a* has a concave interior surface, on which a fluorescent layer 6*b* is provided. The side wall portion 2*a* has a side opening, which is closed by a light transmissive protective plate 7*a*. In this embodiment, the chip 4*a* is adapted to emit a laser beam L3 from one of two laser beam emitting ends, which has an increased laser beam emission rate.

Therefore, the chip 4*a* is inclined by the heat sink block 5*b* so that the laser beam L3 emitted from the laser beam emitting end is efficiently projected on the fluorescent layer 6*b*.

The metal interconnection patterns 8*b* are 9*b* are connected to n- and p-electrodes of the chip 4*a* via fine metal wires 11*a* and 11*b*, respectively.

The chip 4*a* is a laser chip adapted to emit a laser beam having the same wavelength as that of the laser beams emitted from the chip 4 in the first embodiment. The fluorescent layer 6*b*, the side wall portion 2*b*, the protective plate 7*a* and the fine metal wires 11*a*, 11*b* are composed of the same materials as in the first embodiment.

When a predetermined driving voltage is applied between the interconnection patterns 8*b* and 9*b*, the laser beam L3 is emitted from the laser chip 4*a*. The laser beam L3 impinges on the fluorescent layer 6*b* to excite the fluorescent layer 6*b*. Thus, non-coherent white light is generated, and outputted in an arrow direction E from the package 1*b*.

Non-coherent light of any color may be outputted from the package 1*b* according to a particular application by properly selecting the wavelength of the laser beam of the chip 4*a* and the fluorescent material for the fluorescent layer 6*b*.

Fifth Embodiment

Figure 8:
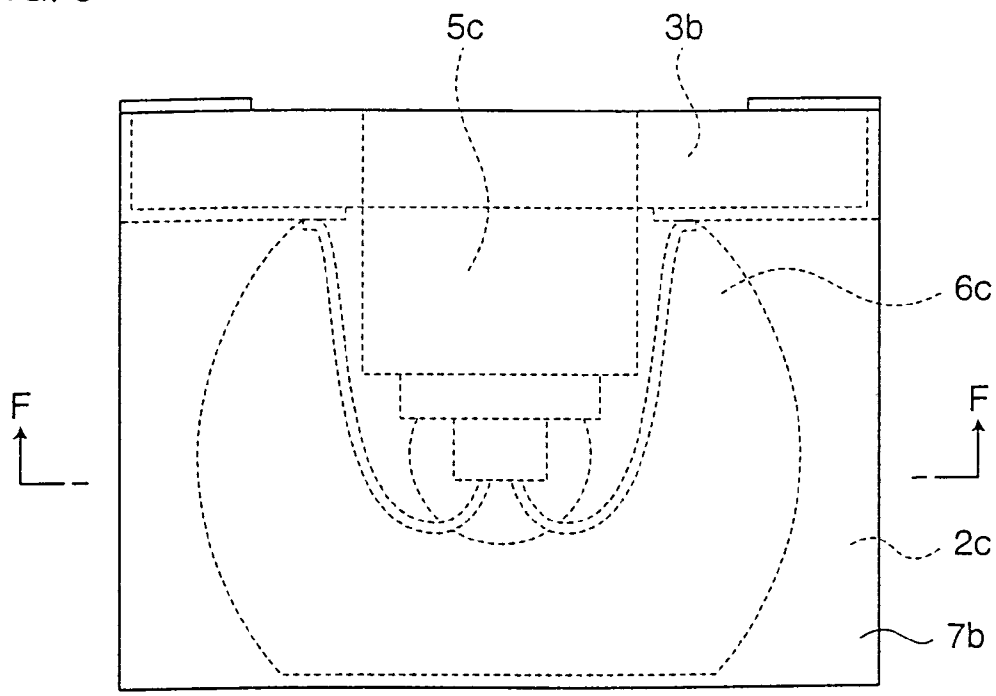
FIG. 8 is a top view of a light emitting device according to a fifth embodiment of the present invention.
Figure 9:
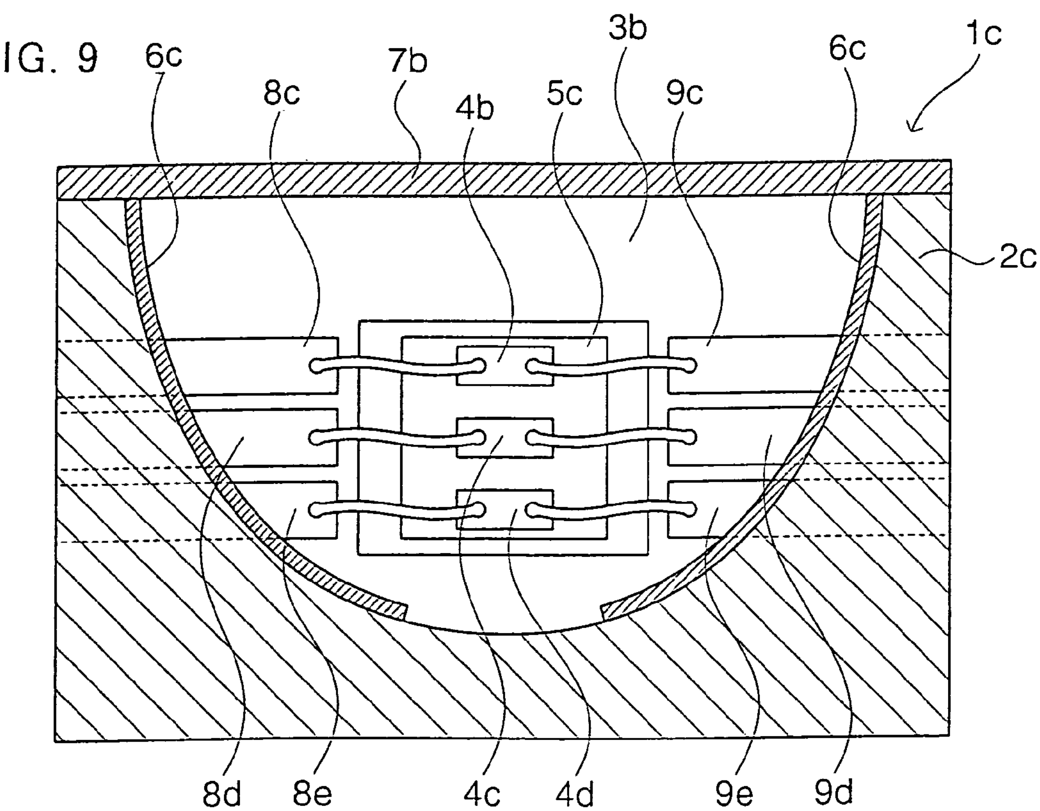
FIG. 9 is a sectional view of the light emitting device as seen in an arrow direction F—F in FIG. 8.

FIG. 8 is a top view of a light emitting device according to a fifth embodiment of the present invention, and FIG. 9 is a sectional view of the light emitting device as seen in an arrow direction F—F in FIG. 8.

As shown, a package 1*c* includes a side wall portion 2*c* having a top opening and a side opening, and a substrate 3*b* which closes the side opening. The substrate 3*b* comprises an insulative substrate having interconnection patterns 8*c* to 8*e* and 9*c* to 9*e*. Three semiconductor laser chips 4*b* to 4*d* are disposed along a vertical line on a metal mount 5*c* in a generally central portion of the package 1*c*. The mount 5*c* extends through the substrate 3*b* as shown in FIG. 8. The side wall portion 2*c* has a concave inside shape as seen in section in FIG. 9, and a reflective layer 6*c* is provided on the interior surface of the side wall portion 2*c*. The reflective layer 6*c* is formed in the same manner as the reflective layer 6*a* in the second embodiment. The chips 4*b* to 4*d* each have n- and p-electrodes which are connected to the interconnection pattern 8*c* to 8*e* and the interconnection pattern 9*c* to 9*e*, respectively, via fine metal wires. The top opening of the side wall portion 2*c* is closed by a light transmissive protective plate 7*b*. The semiconductor laser chips 4*b* to 4*d* are adapted to emit R(red), G(green) and B(blue) laser beams, respectively.

When a predetermined driving voltage is applied to the chips 4*b* to 4*d* between the interconnection patterns 8*c* to 8*e* and 9*c* to 9*e*, the R, G and B laser beams are emitted from the chips 4*b* to 4*d*, and irregularly reflected on the reflective layer 6*c* thereby to be converted into non-coherent light beams with uneven phases. The non-coherent R, G and B light beams are mixed to provide white light, which is outputted through the protective plate 7*b* from the package l*c*.

According to the present invention, the coherence of the laser beam emitted from the semiconductor laser chip is reduced by the coherence reducing member in the package, and the lower coherence light is outputted from the package. Therefore, the light emitting device is safe for human eyes.

What is claimed is:

1. A light emitting device comprising:

a semiconductor laser chip which emits a laser beam;

a reflective member formed of a fluorescent material which is excited by the laser beam to generate a light beam having a greater wavelength than the laser beam; and a protective plate for covering the semiconductor chip and the reflective member, wherein the protective plate contains the same material as the fluorescent material.

2. A light emitting device as set forth in claim 1, wherein the semiconductor laser chip is a chip which emits a purple-blue laser beam, and the fluorescent material is excited by the purple-blue laser beam to generate white light.

3. A light emitting device as set forth in claim 1, wherein the semiconductor laser chip is a laser chip of end light emission type which emits a purple-blue laser beam in two directions parallel to a PN junction plane thereof.

4. A light emitting device as set forth in claim 1, wherein the semiconductor laser chip is a laser chip of face light emission type.

5. A light emitting device as set forth in claim 1, further comprising a positive electrode terminal and a negative electrode terminal for applying a DC voltage to the semiconductor laser chip.

6. A light emitting device as set forth in claim 1, further comprising a metal block for dissipating heat generated by the semiconductor laser chip.

7. A light emitting device as set forth in claim 1, wherein the semiconductor laser chip comprises at least one of three laser chips which emit red, green and blue light beams, respectively.

8. A light emitting device as set forth in claim 6, further comprising a package having the protective plate thereon and housing the semiconductor laser chip and the reflective member therein, wherein the metal block passes through the package.

9. A light emitting device comprising: a semiconductor laser chip which emits a laser beam; a coherence reducing member which receives the laser beam and reduces coherence of the laser beam to generate a lower coherence light beam; and a protective plate for covering the laser chip and the coherence reducing member; wherein the laser beam emitted from the laser chip is converted into the lower coherence light beam by the coherence reducing member, and the protective plate allows the lower coherence light beam to pass therethrough and prevents the laser beam from passing therethrough, wherein the coherence reducing member comprises a reflective member having a roughened reflective surface, the roughened reflective surface having a roughness such that a level difference of undulations thereof is several times to several tens times the wavelength of the laser beam.

* * * * *